United States Patent
Han et al.

(10) Patent No.: US 11,966,625 B2
(45) Date of Patent: Apr. 23, 2024

(54) MEMORY DEVICE AND OPERATING METHOD FOR SETTING AND REPAIRING DATA ERRORS

(71) Applicant: SAMSUNG ELECTRONICS CO., LTD., Suwon-si (KR)

(72) Inventors: Guyeon Han, Suwon-si (KR); Sangwon Park, Seoul (KR); Jinkyu Kang, Hwaseong-si (KR); Raeyoung Lee, Hwaseong-si (KR); Jaeduk Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 44 days.

(21) Appl. No.: 17/722,850

(22) Filed: Apr. 18, 2022

(65) Prior Publication Data

US 2023/0042249 A1    Feb. 9, 2023

(30) Foreign Application Priority Data

Aug. 6, 2021  (KR) .................. 10-2021-0104209

(51) Int. Cl.
*G06F 3/06* (2006.01)
(52) U.S. Cl.
CPC .......... *G06F 3/0655* (2013.01); *G06F 3/0604* (2013.01); *G06F 3/0679* (2013.01)
(58) Field of Classification Search
CPC ..... G06F 3/0655; G06F 3/0604; G06F 3/0679
USPC ....................................................... 711/154
See application file for complete search history.

(56) References Cited

U.S. PATENT DOCUMENTS

| | | | |
|---|---|---|---|
| 9,063,886 B2 | 6/2015 | Post et al. | |
| 9,519,542 B2 | 12/2016 | Zhou et al. | |
| 9,727,452 B2 | 8/2017 | Karamcheti et al. | |
| 10,467,093 B2 | 11/2019 | Werner et al. | |
| 10,915,394 B1 | 2/2021 | Shappir et al. | |
| 2013/0124779 A1* | 5/2013 | Kotzur .................. | G06F 3/0616 711/E12.008 |
| 2020/0183784 A1* | 6/2020 | Shin ...................... | G06F 3/0659 |
| 2020/0301780 A1 | 9/2020 | Kim et al. | |
| 2021/0089229 A1* | 3/2021 | Majerus ................ | G06F 3/0607 |
| 2023/0195385 A1* | 6/2023 | McNeil ................. | G06F 3/0673 711/154 |

FOREIGN PATENT DOCUMENTS

KR    10-2024661 B1    9/2019

* cited by examiner

*Primary Examiner* — Than Nguyen
(74) *Attorney, Agent, or Firm* — Fish & Richardson P.C.

(57) ABSTRACT

Provided are a memory device storing setting data and a memory system including the same. The memory device may include a cell array including a plurality of cell blocks, each including a plurality of pages, and a control logic that controls a program and read operation on the cell array, wherein at least one page of the cell array stores information data read (IDR) data including information related to a setting operation of the memory device, at least one other page of the cell array stores replica IDR data including inverted bit values of the IDR data, and the control logic controls a recovery operation for repairing errors in the IDR data by reading the replica IDR data when a read fail of the IDR data occurs.

12 Claims, 15 Drawing Sheets

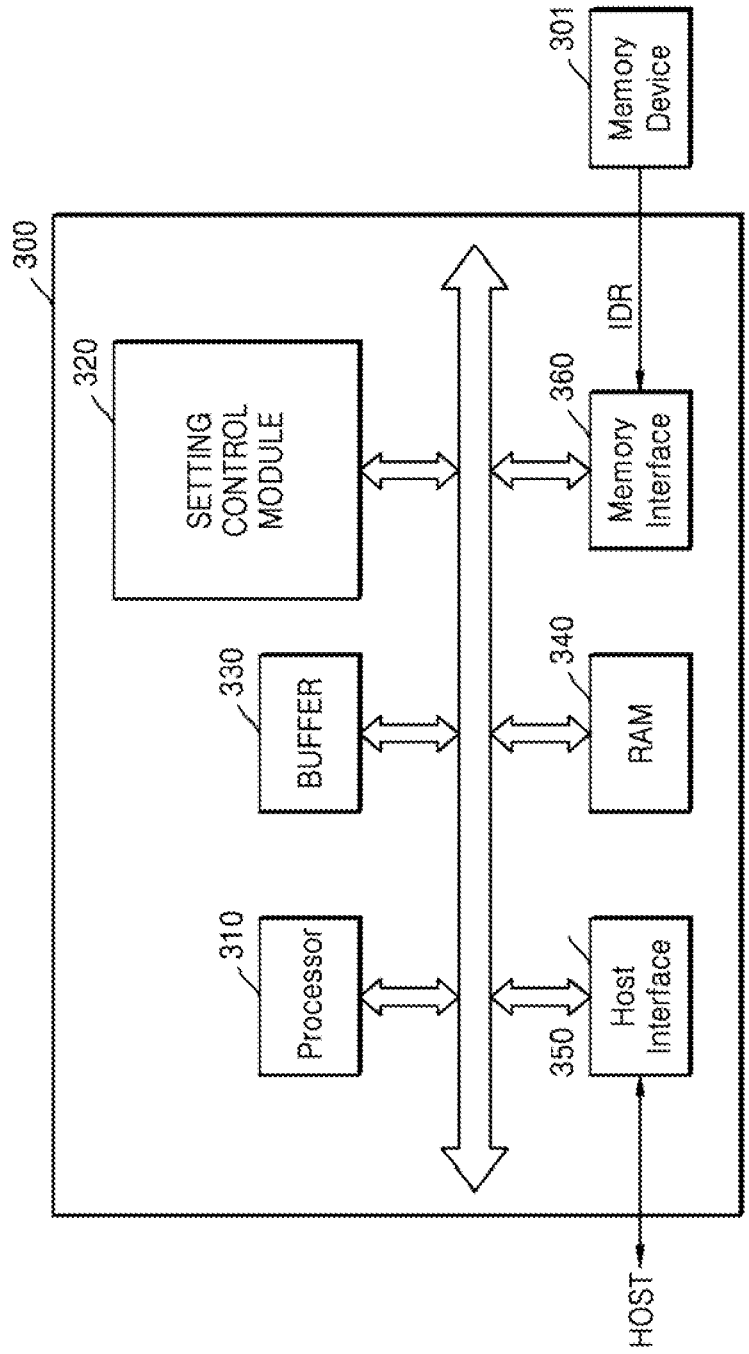

MEMORY DEVICE AND OPERATING METHOD FOR SETTING AND REPAIRING DATA ERRORS

CROSS-REFERENCE TO RELATED APPLICATION

This application is based on and claims priority under 35 U.S.C. § 119 to Korean Patent Application No. 10-2021-0104209, filed on Aug. 6, 2021, in the Korean Intellectual Property Office, the disclosure of which is incorporated by reference herein in its entirety.

BACKGROUND

1. Field

Embodiments relate to a memory device, and more particularly, to a memory device improving the reliability of setting data and an operating method thereof.

2. Description of the Related Art

As a memory device, a non-volatile memory device includes a plurality of memory cells that store data in a non-volatile manner. As an example of a non-volatile memory, a flash memory device may be used in portable phones, digital cameras, portable digital assistants (PDAs), mobile computing devices, stationary computing devices, and other devices.

SUMMARY

A memory device according to an embodiment includes a cell array including a plurality of cell blocks, each cell block including a plurality of pages, and a control logic configured to control a program and read operation on the cell array, wherein at least one page of the cell array stores information data read (IDR) data including information related to a setting operation of the memory device, at least another page of the cell array stores replica IDR data including inverted bit values of the IDR data, and the control logic is configured to, when read fail of the IDR data occurs, control a recovery operation for repairing errors in the IDR data by reading the replica IDR data.

A memory device according to an embodiment includes a cell array including a plurality of cell blocks, each including a plurality of pages, and a control logic configured to control a program and read operation on the cell array, wherein the cell array stores first to Nth IDR data pairs, each of the first to Nth IDR data pairs includes IDR data including information related to a setting operation of the memory device and replica IDR data including inverted bit values of the IDR data, and the control logic is configured to perform a recovery operation for repairing errors in the IDR data based on at least one IDR data pair among the first to Nth IDR data pairs.

An operating method of a memory device according to an embodiment includes reading, from a cell array of the memory device, IDR data including information related to a setting operation of the memory device, determining whether read fail of the read IDR data occurs, when the read fail occurs in the read IDR data, reading, from the cell array, replica IDR data including inverted bit values with respect to the IDR data, and performing a recovery operation for repairing errors in the IDR data by using the read replica IDR data.

BRIEF DESCRIPTION OF THE DRAWINGS

Features will become apparent to those of skill in the art by describing in detail example embodiments with reference to the attached drawings in which:

FIG. 3 is a block diagram illustrating an example embodiment of a controller included in a memory system;

DETAILED DESCRIPTION

Figure 1:
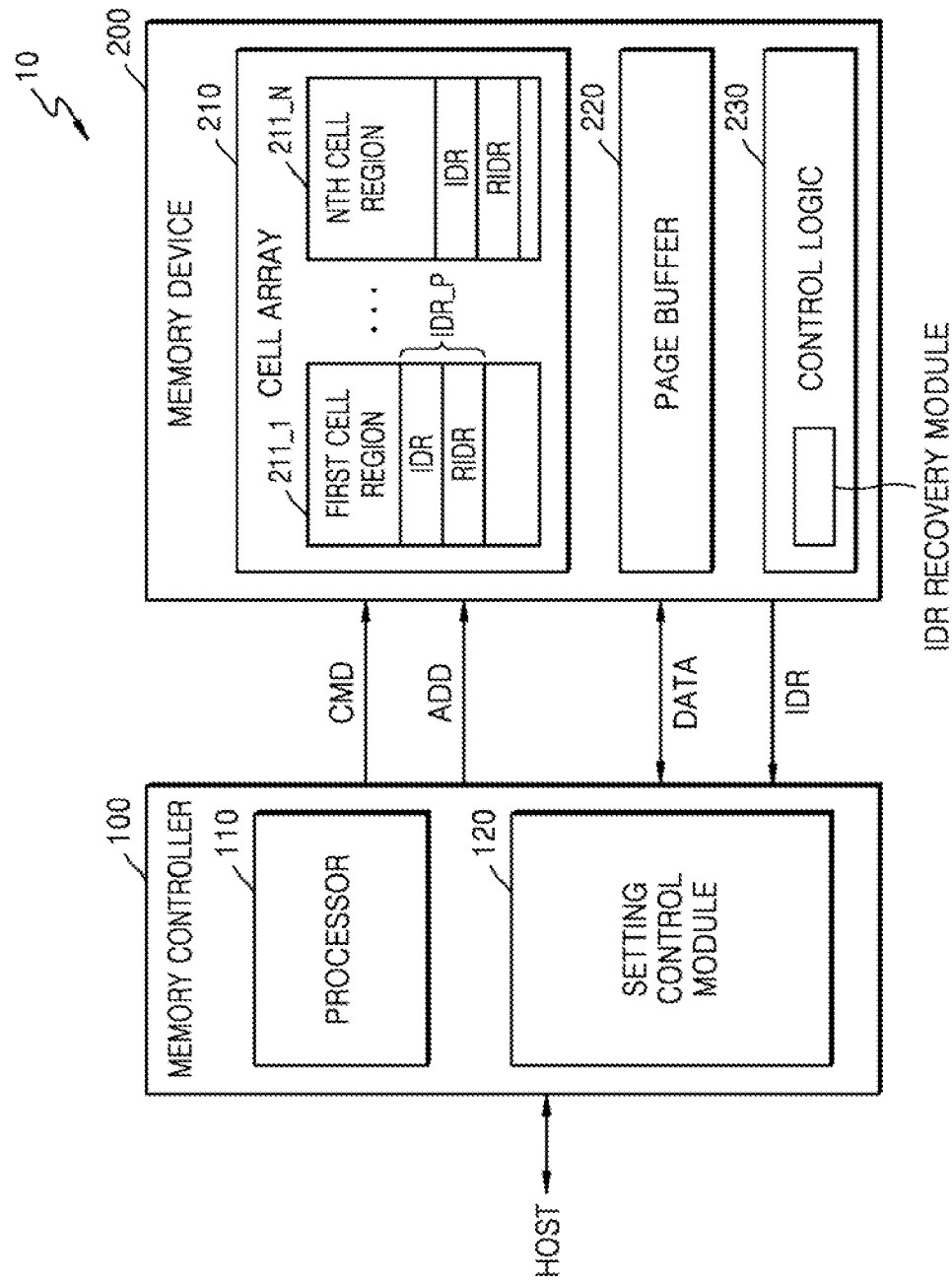
FIG. 1 is a block diagram illustrating a memory system according to an example embodiment.

FIG. 1 is a block diagram illustrating a memory system 10 according to an example embodiment.

Referring to FIG. 1, the memory system 10 may include a memory controller 100 and a memory device 200.

The memory controller 100 may include a processor 110 and a setting control module 120.

The memory device 200 may include a cell array 210, a page buffer 220, and a control logic 230.

According to an example embodiment, the memory device 200 may include a non-volatile memory device. For example, the memory device 200 may include a non-volatile memory device such as NAND flash memory, vertical NAND flash memory, NOR flash memory, resistive random access memory, phase-change memory, magnetoresistive random access memory, or the like. In some example embodiments, the memory device 200 or the memory system 10 may be implemented as an embedded memory embedded in an electronic device, or as an external memory detachable from the electronic device. For example, the memory device 200 or the memory system 10 may be implemented in various forms such as an embedded universal flash storage (UFS) memory device, an embedded multimedia card (eMMC), a solid state drive (SSD), a UFS memory card, a CompactFlash (CF) card, a Secure Digital (SD) card, a micro-SD card, a mini-SD, extreme digital (xD) card, a memory stick, and the like.

The memory controller 100 may control the memory device 200 to read data that is stored in the memory device 200 or to write (or program) data to the memory device 200, in response to a write/read request from a host HOST.

In an example embodiment, the memory controller 100 may control program, read, and erase operations of the memory device 200 by providing an address ADD and a command CMD to the memory device 200. Also, data DATA to be written to the memory device 200 and data DATA read from the memory device 200 may be transmitted and received between the memory controller 100 and the memory device 200. Also, information data read (IDR) data may be read from the memory device 200.

The cell array 210 may include a plurality of cell regions 211_1 to 211_N (also respectively referred to as a first cell region 211_1 to an Nth cell region 211_N). In an example embodiment, each of the plurality of cell regions 211_1 to 211_N may have a certain unit, and for example, each of the plurality of cell regions 211_1 to 211_N may be referred to as a cell block or a plane. Also, each of the plurality of cell regions 211_1 to 211_N may include a plurality of pages, and each of the pages may include a plurality of memory cells. In the cell array 210, a data erase operation may be performed in units of cell blocks, and data program and read operations may be performed in units of pages.

At least some of the plurality of cell regions 211_1 to 211_N may store main data such as setting data related to an operating condition of the memory system 10. Although FIG. 1 illustrates that all of the plurality of cell regions 211_1 to 211_N store setting data (IDR), the setting data may be stored only in some cell regions.

In an initial driving process of a system (for example, the memory system 10) including a non-volatile memory device (e.g., the memory device 200), a process of reading setting data (e.g., DR data) that is set or stored in the non-volatile memory device, and setting various operating conditions of the memory system based on the setting data that is read, may be performed. In an example embodiment, the setting data, e.g., DR data, stored in the non-volatile memory device, e.g., the memory device 200, includes main information related to operation of the memory system, e.g., the memory system 10, and thus, it is important to ensure reliability in the process of reading of the setting data, e.g., the DR data.

As discussed above, at least some of the plurality of cell regions 211_1 to 211_N of the memory device 200 may store setting data in the form of information data read (DR) data (which may be referred to herein as IDR data, and indicated in the drawings as DR). The IDR data is used to set an initial operating condition, e.g., in an initial driving process of the memory system 10. For example, the IDR data may include DC information, option information, repair information, and bad block information, which are used for initialization of the memory system 10. In an example embodiment, the memory device 200 may be a non-volatile memory device that has stored therein or set therein the IDR data during manufacture of the memory device 200, e.g., prior to completion of manufacturing of a component or system that includes the memory device 200. In an example embodiment, the IDR data is stored or set in the memory device 200 (e.g., in at least some of the plurality of cell regions 211_1 to 211_N) during the process of manufacturing. For example, the IDR data may be stored in the memory device 200 prior to mounting the memory device 200 on a board such as a PCB. During the process of manufacturing, e.g., in a process of mounting a flash memory chip on a board, or in a process of mounting additional elements adjacent to the memory device 200, the memory device 200 may be exposed to very high temperatures and the internal temperature of the memory device 200 may become significantly elevated. Such elevated temperatures may have deleterious effects on data retention characteristics of the memory cells storing the IDR data, such that the IDR data stored in the memory device 200 may be deteriorated, e.g., loss or corruption of one or more bits of stored IDR data may occur. Additional aspects of the IDR data and its use and incorporation in a memory device are set forth in U.S. Pat. No. 11,003,393 B2 and 11,056,200 B2, which are hereby incorporated by reference in their entireties for all purposes.

In the memory system 10, an operation of reading the IDR data in order to sett an operating environment or an operating condition, a recovery operation for repairing errors in IDR data, and setting operations using IDR data and/or repaired IDR data may be performed in series.

The various operations as described above may be performed by the memory controller 100 and/or the memory device 200.

In example embodiments described herein, the operation of the reading of the IDR data and the recovery operation are described as being performed by the memory device 200, and the setting operations is described as being performed by the memory controller 100. However, this may be varied, and the memory system 10 may be implemented in such a manner that the operations described above are distributed to the memory controller 100 and the memory device 200 according to various methods. Also, an example in which information storage and recovery operations according to an example embodiment are applied to the setting data is described, but example embodiments are not limited thereto and may be applied to other various types of main data.

In an example embodiment, the IDR data may be information stored during a process of manufacturing the memory system 10 or the memory device 200. In an example embodiment, because the IDR data includes main information, a cell region in which the IDR data is stored may include a single level cell (SLC) structure, whereas a cell region in which user data is stored may store two or more bits of information in one memory cell, e.g., a multi-level cell (MLC) structure. Also, in an example embodiment, a particular cell region may store only the IDR data, or the memory system 10 may be operated in such a manner that the IDR data and the user data are stored together in a shared cell region.

The processor 110 may control overall operations of the memory controller 100. For example, the processor 110 may execute an instruction stored in the memory controller 100 to control an operation of the memory controller 100 or control various operations related to data erase/program/read.

Also, the setting control module 120 may set various operating conditions of the memory device 200 based on the IDR data provided from the memory device 200.

Also, as described in additional detail below, the memory device 200 may repair errors in the IDR data that is read from the cell array 210, and provide the repaired IDR data to the memory controller 100. For example, the control logic 230 may include an IDR recovery module 231 that controls a recovery operation for repairing errors in IDR data.

According to an example embodiment, each of the setting control module 120 and the IDR recovery module 231 may be implemented as hardware or software, or may be implemented as a combination of hardware and software. For example, in the case that the setting control module 120 and the IDR recovery module 231 are implemented as hardware, the setting control module 120 and the IDR recovery module 231 may be respectively referred to as a setting control circuit and an IDR recovery circuit. As another example, in the case that each of the setting control module 120 and the IDR recovery module 231 is implemented as software including firmware, the setting control module 120 and the IDR recovery module 231 may be loaded and executed in a memory (not shown) provided in each of the memory controller 100 and the memory device 200.

The control logic 230 may control overall operations of the memory device 200 in relation to a memory operation. For example, the control logic 230 may generate an internal control signal for an internal control operation of the memory device 200 based on a control signal (not shown) from the memory controller 100.

An example of storing IDR data and replica IDR data according to an example embodiment will now be described.

In a process of manufacturing the memory device 200, the IDR data may be stored in the cell array 210. Also, replica IDR data (which may be referred to herein as replica IDR data, and indicated in the drawings as RIDR) corresponding to the IDR data may be stored in the cell array 210, and may be used to improve the reliability of the IDR data.

Regarding the IDR data and replica IDR data, the data are stored before the product is shipped, and in particular, the data are stored at a predetermined location within the memory (e.g., a cell block at a specific location).

The replica IDR data and the IDR data may be stored in different pages of an identical cell block. The replica IDR data and the IDR data may be stored in different cell blocks.

In an example embodiment, the IDR data may include a plurality of bits, and replica IDR data having inverted values of the plurality of bits may be stored in the cell array 210. Also, the IDR data and the replica IDR data may be defined as constituting an IDR data pair, which may be referred to herein and indicated in the drawings as IDR_P, e.g., IDR_P1, IDR_P2, . . . , IDR_PM).

In other example embodiments, terms related to the IDR data may be defined in various manners. For example, IDR data corresponding to original data may be stored in one cell region, and based on the original data, data copied to the plurality of cell regions 211_1 to 211_N may also be defined as replica IDR data. In this case, in one IDR data pair IDR_P, data having bit values equal to those of the original data may be defined as replica IDR data, and data having inverted bit values with respect to the original data may be defined as inverted replica IDR data.

In example embodiments described hereinafter, information having bit values equal to those of original data stored in the cell array 210 may be referred to as IDR data, and information having inverted bit values of the original data may be referred to as replica IDR data.

Assuming that IDR data stored in the first cell region 211_1 is original data, the control logic 230 may receive the IDR data stored in the first cell region 211_1 through the page buffer 220 and determine whether a read fail of the IDR data occurs. If errors or uncorrectable errors occur in the IDR data, the read fail of the IDR data may be determined, and a series of operations for a recovery operation may be controlled.

For example, the control logic 230 may read one or more IDR data pairs IDR_P stored in the cell array 210, and based on the one or more IDR data pairs IDR_P, perform a recovery operation. For example, replica IDR data stored in the first cell region 211_1 may be read, whether a read fail of the read replica IDR data occurs may be determined, and when the read fail of the replica IDR data does not occur, inverted bit values of the replica IDR data may be used as IDR data. Alternatively, a plurality of IDR data pairs IDR_P stored in the cell array 210 may be read, a plurality of bit values related to respective bits of IDR data may be determined from the plurality of IDR data pairs IDR_P, and, by applying a majority rule with respect to the plurality of determined bit values, each of the bit values (or logic states) of the IDR data may be determined. Aspects of these operations will now be described in additional detail.

Hereinafter, referring to FIGS. 2A and 2B, a detailed example of storing IDR data and replica IDR data according to an example embodiment is described as follows.

Figure 2A:
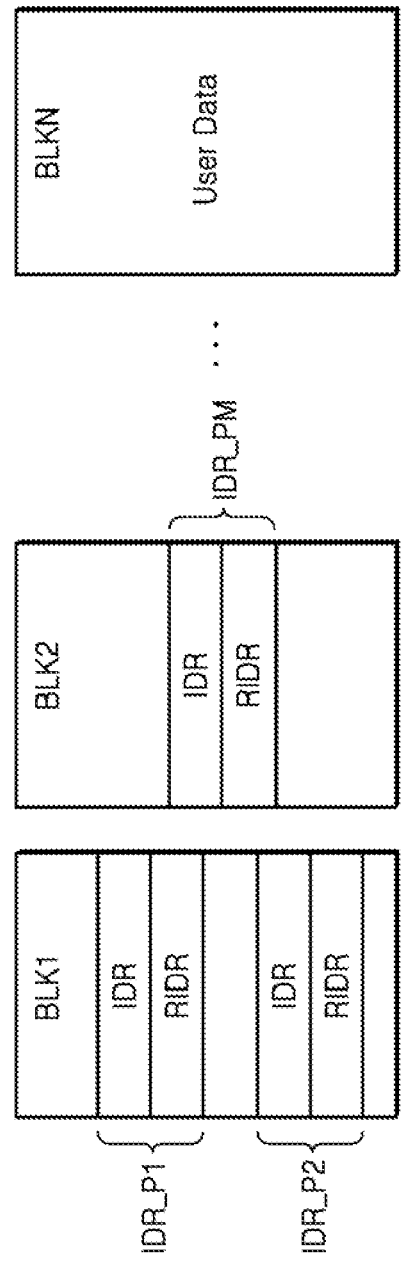
FIGS. 2A and 2B are diagrams illustrating an example of storing information data read (IDR) data and replica IDR data.
Figure 2B:
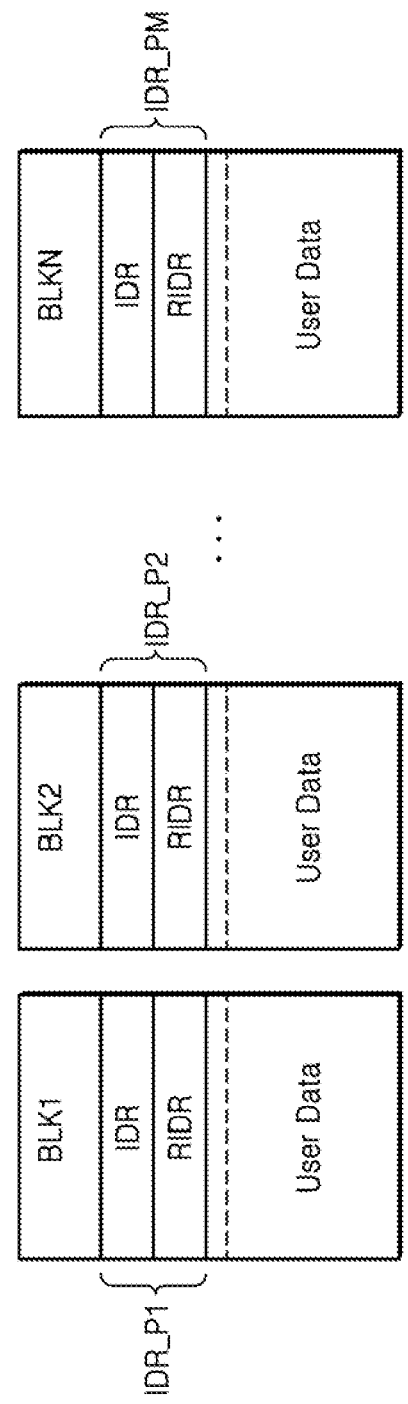

FIGS. 2A and 2B show, by way of example, a case in which one piece of IDR data is stored, as original data, in one page of a cell region, but IDR data may be stored in a plurality of pages or may be stored in a plurality of cell regions. Also, in FIGS. 2A and 2B, a cell block is exemplified as a cell region in which IDR data is stored.

A cell array may include first to Nth cell blocks BLK1 to BLKN as a plurality of cell regions.

In a process of manufacturing a memory device, an IDR data pair may be stored in at least some of the first to Nth cell blocks BLK1 to BLKN in relation to setting an operating condition of a memory system including the memory device. For example, in FIG. 2A, some of the first to Nth cell blocks BLK1 to BLKN store setting data, others store user data, and first to Mth IDR data pairs IDR_P (e.g., IDR_P1 to IDR_PM) are stored in the cell array 210 as setting data.

IDR data corresponding to original data may be stored in one page of the first cell block BLK1. Replica IDR data (which may be generated by performing a NOT operation on the IDR data) may be stored in another page of the first cell block BLK1. The IDR data and the replica IDR data may constitute the first IDR data pair IDR_P1.

Also, additional IDR data pairs may be further stored in one or more cell blocks. For example, in FIG. 2A, the second to Mth IDR data pairs IDR_P2 to IDR_PM are further stored in the first cell block BLK1 and the second cell block BLK2. For example, IDR data corresponding to original data may be copied to the first cell block BLK1 and the second cell block BLK2, and replica IDR data having inverted values of bits of the original data may be copied to the first cell block BLK1 and the second cell block BLK2.

In an example shown in FIG. 2B, setting data is stored together with user data in at least some of the first to Nth cell blocks BLK1 to BLKN, and for example, the first to Mth IDR data pairs IDR_P1 to IDR_PM based on IDR data corresponding to original data may be stored in the first to Nth cell blocks BLK1 to BLKN. Also, in each cell block, user data may be stored in a region in which setting data is not stored. Also, to ensure reliability of setting data, in each cell block, one bit may be stored in each of memory cells of a region in which setting data is stored, whereas two or more bits may be stored in each of memory cells of a region in which user data is stored.

As discussed above, during a process of manufacturing a memory system, in a process of mounting a memory device such as a flash memory chip on a board or mounting elements adjacent to the memory device, extremely high-temperature heat may be applied to the memory device, and in this case, retention characteristics of IDR data stored in the memory device may be deteriorated. If errors in the IDR data are not repaired, errors may occur in setting an operating environment of the memory system including the memory device, which may cause a state in which the use of the memory device is impossible. Also, when high-temperature heat is applied to the memory device, deterioration may occur in that a threshold voltage level of memory cells having a programmed state may decrease, which may result in data of programmed memory cells being lost.

In a process of initializing the memory system, IDR data stored in the first cell block BLK1 may be read, and whether a read fail of the read IDR data occurs may be determined. For example, whether a read fail occurs may be determined according to whether errors in the IDR data read from the first cell block BLK1 are correctable, and when it is determined that read fail has occurred, a recovery operation may be performed by reading replica IDR data of the first IDR data pair IDR_P1, or a recovery operation may be performed by reading one or more other IDR data pairs.

According to embodiments, because a recovery operation may be performed based on replica IDR data including inverted bit values of the IDR data as described above, a bit in which errors have occurred in a process of reading the IDR data and a bit in which errors have occurred in a process of reading the replica IDR data may be of different positions, and thus, the number of bits in which errors occur in all processes of the reading described above may be reduced or minimized.

In general, if data reliability is provided for by merely storing a plurality of pieces of IDR data having the same bit values, e.g., identical or duplicate IDR data, errors may nonetheless occur in the same bits of the plurality of pieces of IDR data (e.g., due to application of the high heat as described above). In such a case, the original bit values may not be determined.

In contrast, according to the present example embodiment, because replica IDR data includes inverted bit values with respect to IDR data, bits in which errors occur in all processes of reading the IDR data and the replica IDR data may be minimized, and a recovery operation based on a plurality of IDR data pairs each including original data and replica IDR data having the inverted bit values may be performed, and thus, the possibility of success of the recovery operation may be improved.

Regarding a recovery operation according to an example embodiment, when a read fail of IDR data of the first IDR data pair IDR_P1 corresponding to original data occurs, replica IDR data of the first IDR data pair IDR_P1 may be read, and the second to Mth IDR data pairs IDR_P2 to IDR_PM may be read. Also, for each of bits in which errors have occurred in the IDR data, the errors of the bits may be repaired based on at least some of the first to Mth IDR data pairs IDR_P1 to IDR_PM that have been read through the above process, and for example, the errors may be repaired based on a majority rule using bit values determined from a plurality of IDR data pairs.

Alternatively, when a read fail of IDR data of the first IDR data pair IDR_P1 occurs, replica IDR data of the first IDR data pair IDR_P1 may be read, and whether a read fail of the read replica IDR data occurs may be determined. If the read fail of the replica IDR data does not occur, inverted bit values of the replica IDR data may be used as the IDR data. In contrast, when the read fail of the replica IDR data occurs, a recovery operation based on the majority rule may be performed.

FIG. 3 is a block diagram illustrating an example embodiment of a controller included in a memory system.

Referring to FIG. 3, a memory controller 300 may include a processor 310, a setting control module 320, a buffer 330, random access memory (RAM) 340, a host interface 350, and a memory interface 360. The processor 310 may be electrically connected to various components in the memory controller 300 through a bus, and may perform a control operation thereon.

The processor 310 may control a memory device 301 to perform a memory operation in response to a request received from a host HOST. Also, the processor 310 may perform overall control operations of a memory system by executing instructions stored in the RAM 340. For example, mapping information used to convert a logical address into a physical address of the memory device 301 may be stored in the RAM 340. In the buffer 330, write data transmitted from the host HOST may be temporarily stored or read data read from the memory device 301 may be temporarily stored.

The host interface 350 may communicate with the host HOST according to a certain interface. The host interface 350 may include, for example, an advanced technology attachment (ATA) interface, a serial advanced technology attachment (SATA) interface, a parallel advanced technology attachment (PATA) interface, a universal serial bus (USB) or serial attached small computer system (SAS) interface, a small computer system interface (SCSI), an embedded multi-media card (eMMC) interface, and a Unix file system (UFS) interface, etc.

The memory interface 360 may be electrically connected to the memory device 301, and may receive, from the memory device 301, the IDR data according to an example embodiment.

In addition, the setting control module 320 may set various operating conditions of the memory device 301 based on IDR data according to example embodiments.

According to an example embodiment, when various controls related to setting operating conditions are performed by software, the setting control module 320 may be implemented by firmware including one or more instructions, and the instructions included in the setting control module 320 may be loaded into the RAM 340.

Figure 4:
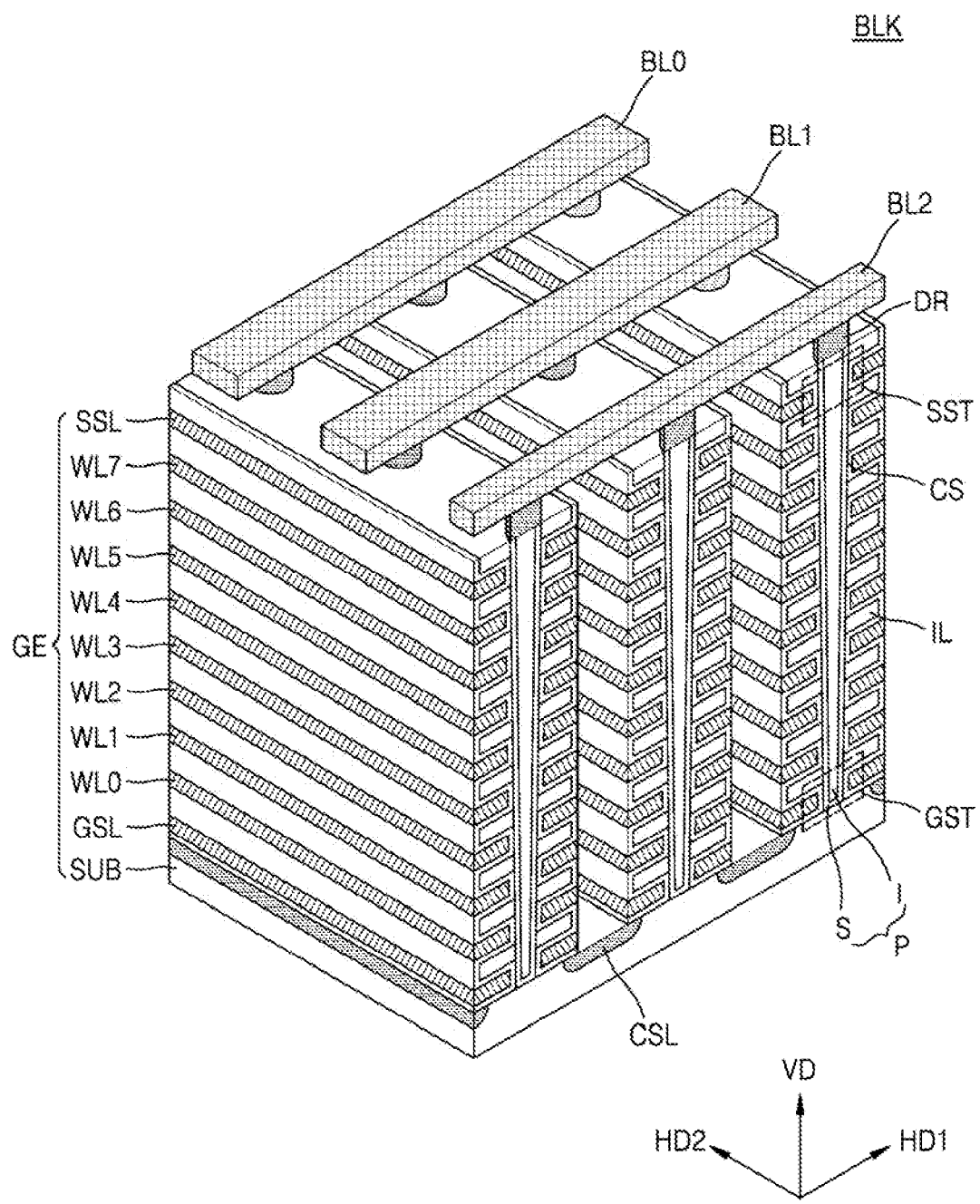
FIG. 4 is a perspective view illustrating an example embodiment of a cell block of a memory device.

FIG. 4 is a perspective view illustrating an example embodiment of a cell block of a memory device.

Referring to FIG. 4, a cell block BLK is formed in a direction perpendicular to a substrate SUB. The substrate SUB has a first conductivity type (for example, a p type), and a common source line CSL extending in a second horizontal direction HD2 on the substrate SUB and doped with impurities of a second conductivity type (for example, an n type) may be provided. A plurality of insulating layers IL extending in the second horizontal direction HD2 are sequentially provided in a vertical direction VD in a region of the substrate SUB between two neighboring common source lines CSL, and the plurality of insulating layers IL are apart from each other by a specific distance in the vertical direction VD. For example, the plurality of insulating layers IL may include an insulating material such as silicon oxide.

A plurality of pillars P sequentially arranged in a first horizontal direction HD1 and penetrating the plurality of insulating layers IL in the vertical direction VD are provided in a region of the substrate SUB between two neighboring common source lines CSL. For example, the plurality of pillars P may penetrate the plurality of insulating layers IL and contact the substrate SUB. For example, a surface layer S of each of the pillars P may include a silicon material having a first type and may function as a channel region. In addition, an inner layer I of each of the pillars P may include an insulating material such as silicon oxide or an air gap.

In a region between two neighboring common source lines CSL, a charge storage layer CS is provided along exposed surfaces of the insulating layers IL, the pillars P, and the substrate SUB. The charge storage layer CS may include a gate insulating layer (also referred to as a "tunneling insulating layer"), a charge trap layer, and a blocking insulating layer. For example, the charge storage layer CS may have an oxide-nitride-oxide (ONO) structure. Also, a gate electrode GE such as select lines GSL and SSL and word lines WL0 to WL7 is provided on an exposed surface of the charge storage layer CS in a region between two neighboring common source lines CSL.

Drains or drain contacts DR are respectively provided on the plurality of pillars P. For example, drains or drain contacts DR may include a silicon material doped with impurities having a second conductivity type. Bit lines BL1 to BL2 extending in the first horizontal direction HD1 and spaced apart from each other by a specific distance in the second horizontal direction HD2 are provided on the drains or drain contacts DR.

Figure 5:
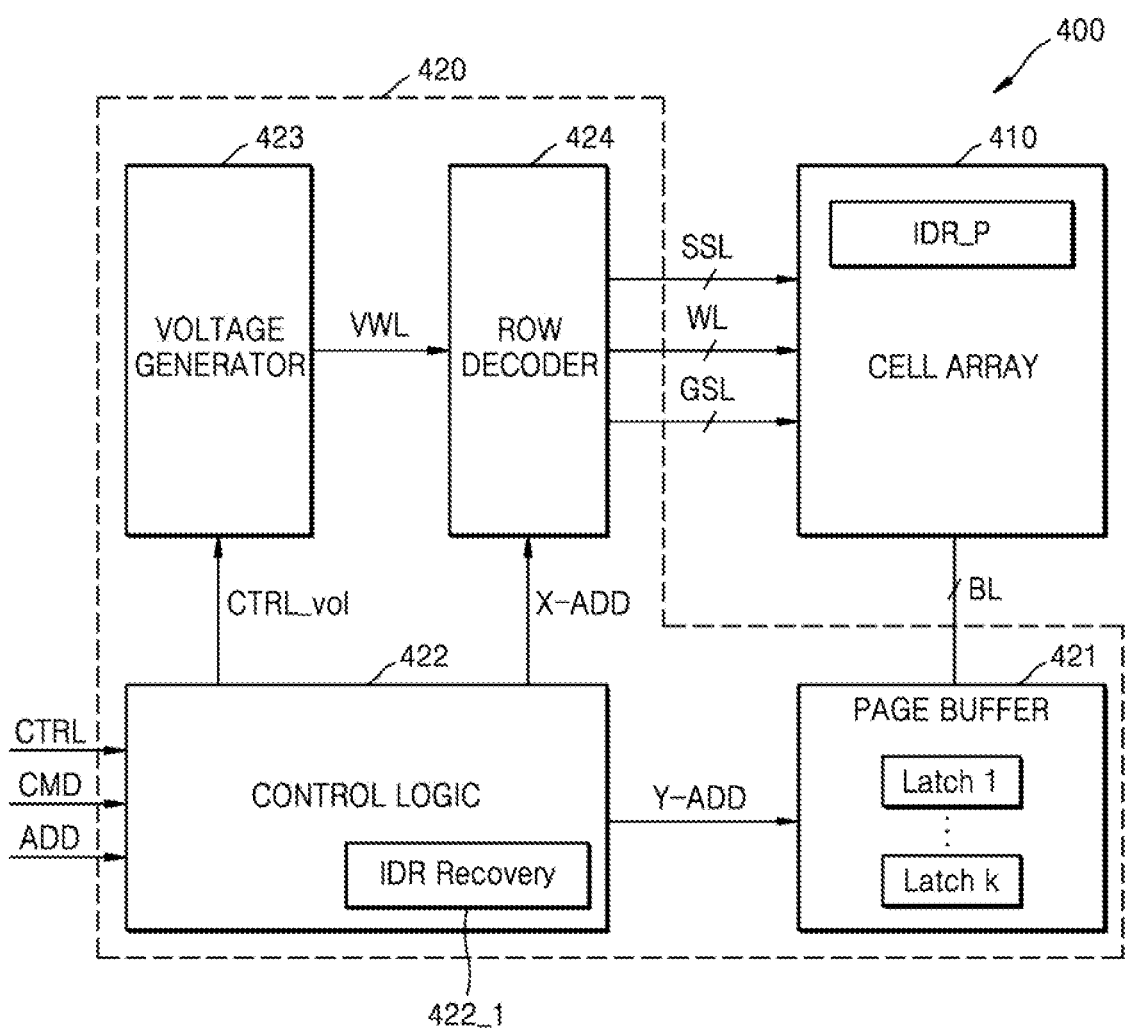
FIG. 5 is a block diagram illustrating a memory device according to an example embodiment.

FIG. 5 is a block diagram illustrating a memory device according to an example embodiment.

Referring to FIG. 5, a memory device 400 may include a cell array 410 and a peripheral circuit 420, and the peripheral circuit 420 may include a page buffer 421, a control logic 422, a voltage generator 423, and a row decoder 424. Although not shown in FIG. 5, the peripheral circuit 420 may further include various components such as a data input/output circuit or an input/output interface.

The cell array 410 may be connected to the page buffer 421 through a plurality of bit lines BL, and may be connected to the row decoder 424 through word lines WL, string select lines SSL, and ground select lines GSL. The cell array 410 may include a plurality of memory cells, and for example, the memory cells may be flash memory cells.

Also, the cell array 410 may store the plurality of IDR data pairs IDR_P according to example embodiments.

The control logic 422 may program data in the cell array 410 based on a command CMD, an address ADD, and a control signal CTRL, and may output various control signals for reading the data from the cell array 410, for example, a voltage control signal CTRL_vol, a row address X-ADD, and a column address Y-ADD.

Also, according to example embodiments, the control logic 422 may include an IDR recovery module 422_1 that recovers IDR data based on IDR data pairs IDR_P.

The voltage generator 423 may generate various types of voltages for performing program, read, and erase operations on the cell array 410 based on the voltage control signal CTRL_vol. For example, the voltage generator 423 may generate a word line voltage VWL, for example, a program voltage, a read voltage, and an erase voltage. Also, the voltage generator 423 may further generate a string select line voltage and a ground select line voltage based on the voltage control signal CTRL_vol.

The page buffer 421 may be connected to a page of the cell array 410 through the plurality of bit lines BL. For example, the page buffer 421 may include one or more latches for storing data corresponding to a page, and for example, the page buffer 421 may include first to Kth latches.

As an operation example, each of the first to Kth latches may store data of one page of the cell array 410, IDR data in the IDR data pair IDR_P may be stored in one latch, and replica IDR data may be stored in another latch. For example, when IDR data is read and stored in the first latch and replica IDR data is read, the IDR data stored in the first latch shifts to the second latch, and the replica IDR data read from the cell array 410 may be stored in the first latch.

According to an example embodiment, the IDR recovery module 422_1 may control a recovery operation based on a plurality of IDR data pairs IDR_P read from the cell array 410. For example, regarding a recovery operation of IDR data, an operation of reading one or more IDR data pairs IDR_P and an operation of determining bit values of the one or more read IDR data pairs IDR_P may be performed based on the control by the IDR recovery module 422_1.

According to example embodiments, when a read fail of IDR data occurs, the IDR recovery module 422_1 may control recovery IDR data, which constitutes an IDR data pair identical to the read IDR data, to be read, determine whether a read fail of the read recovery IDR data occurs, and as a result of the determining, perform recovery based on the read recovery IDR data. Alternatively, when a read fail of IDR data occurs, the IDR recovery module 422_1 may control a plurality of IDR data pairs IDR_P to be read, and perform recovery based on a majority rule for each of bit values of the plurality of read IDR data pairs IDR_P.

Figure 6:
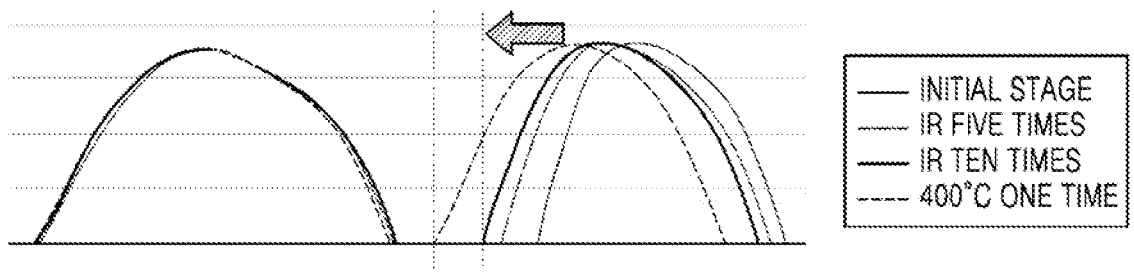
FIG. 6 is a diagram illustrating an example of IDR data deterioration that may occur in a process of manufacturing a memory device.

FIG. 6 is a diagram illustrating an example of IDR data deterioration that may occur in a process of manufacturing a memory device.

Referring to FIG. 6, in a process of mounting a memory device such as a flash memory chip on a board or mounting elements adjacent to the memory device, extremely high-temperature heat may be applied to the memory device, and in this case, retention characteristics of IDR data stored in the memory device may be deteriorated. For example, high-temperature infrared rays IR may be applied to the memory device several times or higher-temperature heat (approximately 400 degrees Celsius is illustrated) may be applied to the memory device, and in this case, due to charge leakage of memory cells in which the IDR data is programmed, a phenomenon in which distribution is shifted to reduce a threshold voltage thereof may occur. For example, due to various factors such as a temperature of heat applied to the memory device and the number of applications, deterioration as shown in FIG. 6 may occur, and data of at least some of memory cells programmed to have a relatively high threshold voltage level may be lost.

For example, without application of embodiments, when only a plurality of pieces of IDR data having bit values equal to those of original data are stored in the memory device, due to application of the high-temperature heat as described above, the plurality of pieces of IDR data may have the same deterioration characteristics, and thus, when retention characteristics are deteriorated due to the high heat as described above, simultaneous errors may occur in specific bits of the IDR data, and the possibility that the errors are unrepairable may increase.

In contrast, according to example embodiments, replica IDR data obtained by inverting bit values of IDR data is stored in the memory device, and the possibility that errors occur in the same bits in a process of reading the IDR data and the replica IDR data may be reduced, and thus, the probability of success of a recovery operation for repairing errors in the IDR data may be improved.

Figure 7:
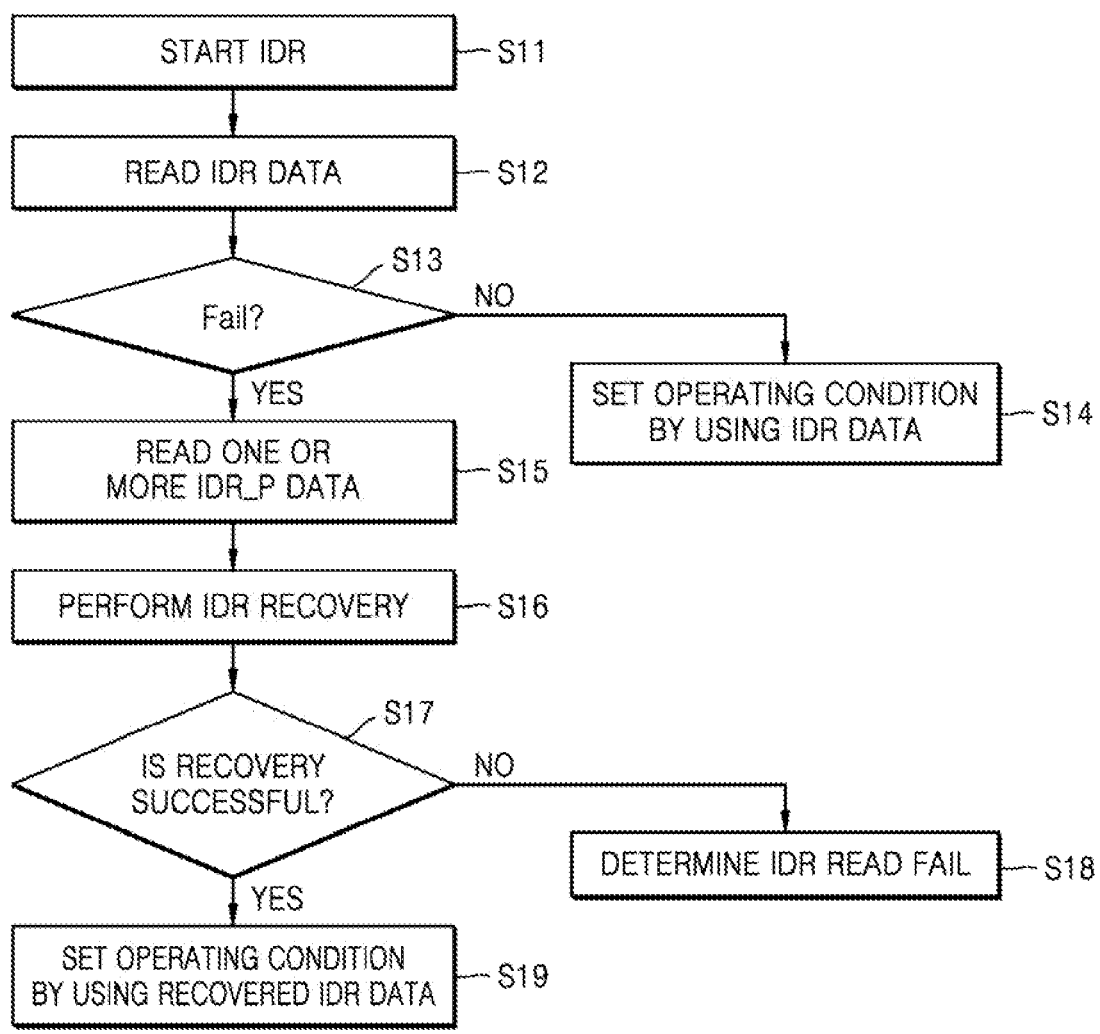
FIG. 7 is a flowchart illustrating an operating method of a memory system, according to an example embodiment.

FIG. 7 is a flowchart illustrating an operating method of a memory system, according to an example embodiment.

Referring to FIG. 7, in an initial driving process of the memory system, an IDR process for reading IDR data that is pre-stored in the memory device may be started (operation S11).

As the IDR process starts, the IDR data may be read as setting data stored in a cell array (operation S12). According to example embodiments, the read IDR data may be original data including a plurality of bits stored in one or more pages, and a plurality of pieces of IDR data including bit values equal to those of the original data and a plurality of pieces of replica IDR data including inverted bit values with respect to the original data may be copied to the cell array.

An error detection operation may be performed on the read IDR data, and whether a read fail of the IDR data occurs may be determined based on error detection (operation S13). If it is determined that reading of the IDR data is successful because there is no error or only correctable errors in the read IDR data, an initialization operation such as setting an operating condition of a memory system by using the read IDR data may be performed (operation S14).

In contrast, when it is determined that a read fail of the read IDR data occurs, a process of reading one or more IDR data pairs IDR_P may be performed (operation S15). For example, as in the example embodiments described above, one or more IDR data pairs IDR_P including IDR data and replica IDR data may be read, and an IDR recovery operation may be performed using the one or more read IDR data pairs IDR_P (operation S16). As the IDR data and the replica IDR data, which have different bit values, are used for the IDR recovery operation, the probability that errors overlappingly occur with respect to the same bits may be reduced, and whether recovery is successful may be determined based on whether all bits of the IDR data may be determined (operation S17). If the recovery fails because some bits of the IDR data are not determined even in the IDR recovery operation, IDR read fail may be finally determined (operation S18).

In contrast, a case where it is determined that the recovery is successful in the IDR recovery operation indicates a case where the bit values of the original IDR data may be determined, and thus, an operation of setting an operating condition for the memory system by using the IDR data in which errors are repaired may be performed (operation S19).

Hereinafter, a detailed example of a recovery operation according to example embodiments is described.

Figure 8:
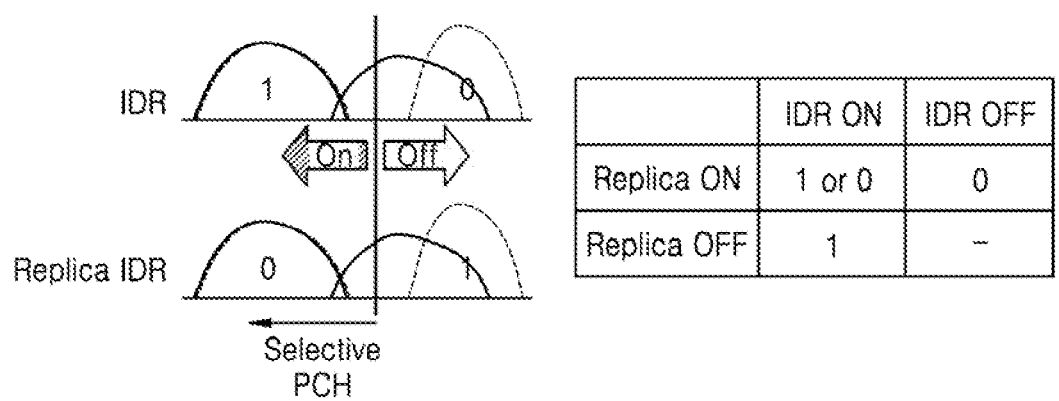
FIG. 8 shows an example of a threshold voltage distribution of memory cells in which IDR data and replica IDR data are stored.

FIG. 8 shows an example of a threshold voltage distribution of memory cells in which IDR data and replica IDR data are stored.

Referring to FIG. 8, each of a plurality of bits of the IDR data may have a bit value of "1" or "0", and it may be determined that, among a plurality of memory cells in which the IDR data is stored, based on a certain read level, an on cell (or memory cells having a relatively small threshold voltage) has a bit value of "1" and an off cell has a bit value of "0". In contrast, in the case of the replica IDR data, information obtained by inverting bit values read from memory cells may be stored in a page buffer, and thus, based on the certain read level, information having a bit value of "0" corresponding to the on cell may be stored in the page buffer, whereas information having a bit value of "1" corresponding to the off cell may be stored in the page buffer.

In this case, as threshold voltage distribution of the memory cells is deteriorated, some memory cells may be determined as on cells despite being programmed as off cells in a process of reading the IDR data, and memory cells programmed as off cells may be erroneously determined as on cells even in a process of reading the replica IDR data. As shown in FIG. 8, in the case of the DR data, a bit value "0" may be erroneously determined as a bit value "1", whereas in the case of the replica DR data, a bit value "1" may be erroneously determined as a bit value "0".

According to the example of the threshold voltage distribution shown in FIG. 8, bit values of memory cells determined as on cells in both of the process of the reading of the IDR data and the process of the reading of the replica DR data may correspond to "1" or "0", thereby indicating a case where the bit values are not determined. For example, bit values of some of the memory cells determined as on cells in both of the process of the reading of the IDR data and the process of the reading of the replica DR data are normally read as "0", whereas bit values of others may be erroneously read as "0" even though a normal bit value corresponds to "1".

In contrast, in the process of the reading of the DR data, bit values of memory cells determined as off cells may be determined as "0", and in the process of the reading of the replica IDR data, bit values of memory cells determined as off cells may be determined as "1". According to an example embodiment, off cells are degraded to on cells based on a certain read level, and thus, it is assumed that there is no case where memory cells are determined as off cells in both of the process of the reading of the DR data and the process of the reading of the replica IDR data.

After a value of each of bits is determined based on an DR data pair (for example, referred to as a first DR data pair) including the IDR data and the replica IDR data, a bit value determination operation for at least one other IDR data pair (referred to as a plurality of second IDR data pairs) may be performed. For example, with respect to one or more bits for which values are not determined in the first IDR data pair, bit values may be determined by a read and determination operation for the plurality of second IDR data pairs. In an example embodiment, a value of a specific bit may be determined as "1" or "0" based on the plurality of second DR data pairs, and the value of the specific bit may be determined as one of "1" and "0" based on a majority rule.

As in an example embodiment shown in FIG. 8, a case where a bit value of data is not determined may correspond to a case where memory cells are determined as on cells in both of a process of reading DR data and a process of reading replica DR data, and thus, a precharge operation may be selectively performed on only some of bit lines in the process of the reading of the replica DR data. For example, as precharge may not be performed on bit lines connected to memory cells determined as off cells in a process of reading DR data, a read operation may not be performed on the memory cells connected to the bit lines on which the precharge is not performed in a process of reading replica IDR data.

Figure 9:
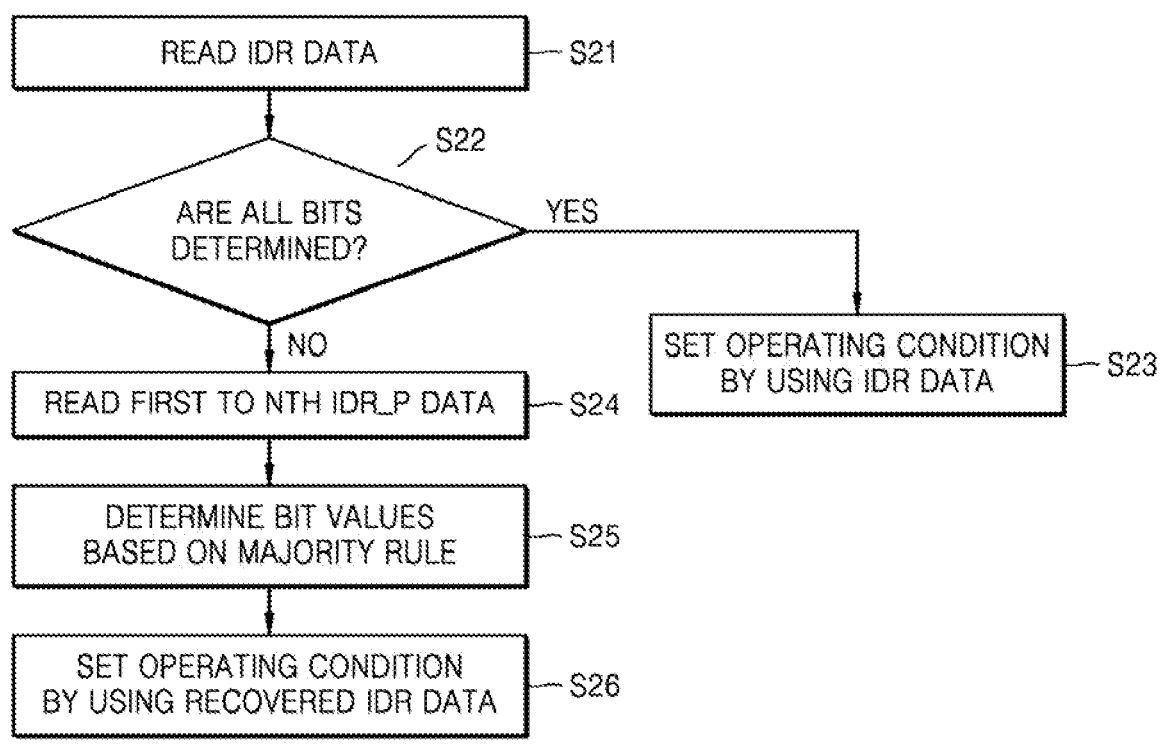
FIG. 9 is a flowchart illustrating an example of data determination according to a majority rule, according to example embodiments.

FIG. 9 is a flowchart illustrating an example of data determination according to a majority rule, according to example embodiments.

Referring to FIG. 9, DR data stored in one or more pages of a memory device may be read in a process of initializing a memory system (operation S21).

Whether all bits of the read DR data are determined may be determined (operation S22). If, as a result of the determining, values of all bits of the DR data are normally determined, an initialization operation such as setting an operating condition of the memory system by using the read IDR data may be performed (operation S23).

In contrast, when values of some bits are not normally determined because errors occur in the read IDR data, a read operation may be performed on replica IDR data stored in the memory device, and for example, one or more DR data pairs each including DR data and replica IDR data may be read. In FIG. 9, first to Nth DR data pairs IDR_P are read, in which N may be an integer of 2 or more (operation S24), and in an example embodiment, as a first IDR data pair includes the read IDR data, the first IDR data pair may be configured by reading only replica IDR data.

A recovery operation may be performed based on the read first to Nth IDR data pairs IDR_P, and thus, bit values of the IDR data may be determined. For example, each bit value may be determined from the read first to Nth IDR data pairs IDR_P, and a value of each bit of the IDR data may be determined by applying a majority rule based on a result of the determining of bit values from the first to Nth IDR data pairs IDR_P (operation S25). Also, when all bit values of the IDR data are determined based on the majority rule, a setting operation for the memory system may be performed using the IDR data in which the errors are repaired through the recovery operation (operation S26).

Figure 10:
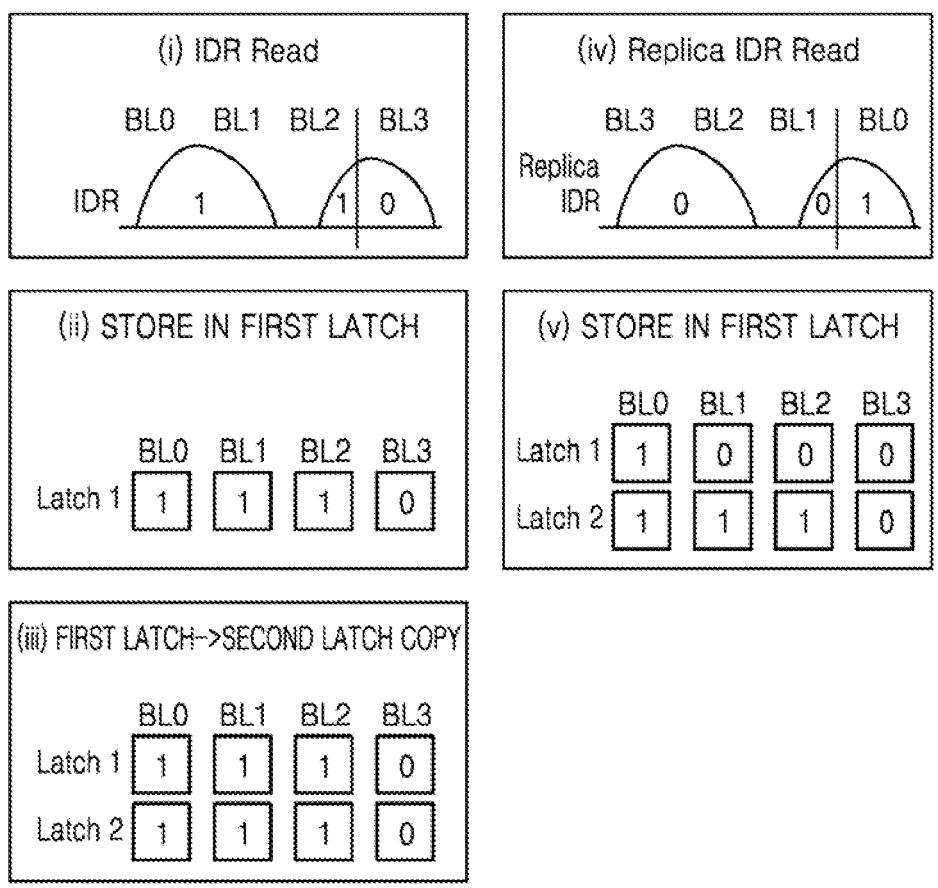
FIG. 10 is a diagram illustrating an example in which a result of reading an IDR data pair is stored in latches, according to an example embodiment.

FIG. 10 is a diagram illustrating an example in which a result of reading an IDR data pair is stored in latches, according to an example embodiment.

FIG. 10 shows, by way of example, bit values of four bits stored in memory cells connected to first to fourth bit lines BL0 to BL3.

A memory device may include one or more latches for storing data, and for example, may include a plurality of latches for storing data read from a plurality of pages. According to an example embodiment, IDR data and replica IDR data constituting one IDR data pair are stored together in a first latch and a second latch.

In (i) and (ii) of FIG. 10, bit values of read IDR data are stored in the first latch, and as retention characteristics of a memory cell corresponding to the third bit line BL2 are deteriorated, a bit value is erroneously determined as "1". Whether the read IDR data fails may be determined, as shown in (iii) of FIG. 10, IDR data stored in the first latch is copied to the second latch as it is determined that the read IDR data fails, and as shown in (iv) of FIG. 10, a read operation for a page in which replica IDR data is stored may be performed.

According to the read operation, as shown in (v) of FIG. 10, bit values of the replica IDR data may be stored in the first latch, and bit values of the IDR data may be stored in the second latch. In this case, in the case of memory cells determined as off cells once in the read process, data may be normally stored in the first latch and the second latch as a value of "1" or "0", and for example, a bit value of "1" may be normally determined from memory cells corresponding to the first bit line BL0, and a bit value of "0" may be normally determined from memory cells corresponding to the fourth bit line BL3.

In contrast, memory cells corresponding to the second bit line BL1 and the third bit line BL2 may each be determined as an on cell in the read process, and thus, bit values of data stored in the first latch and the second latch may be different. In this case, it may be determined that bit values of the memory cells corresponding to the second bit line BL1 and the third bit line BL2 are not normally determined. The IDR recovery module according to the example embodiments may determine whether each bit is determinable based on the bit values stored in the first and second latches.

As one or more bit values are not determined, a plurality of other IDR data pairs may be read, and the recovery operation (for example, a bit value determination operation based on a majority rule) according to example embodiments may be performed. For example, bit values of memory cells corresponding to the second bit line BL1 and the third bit line BL2 may be normally determined from one or more IDR data pairs, and a value of each bit may be determined by applying a majority rule based on a plurality of determined bit values.

Figure 11:
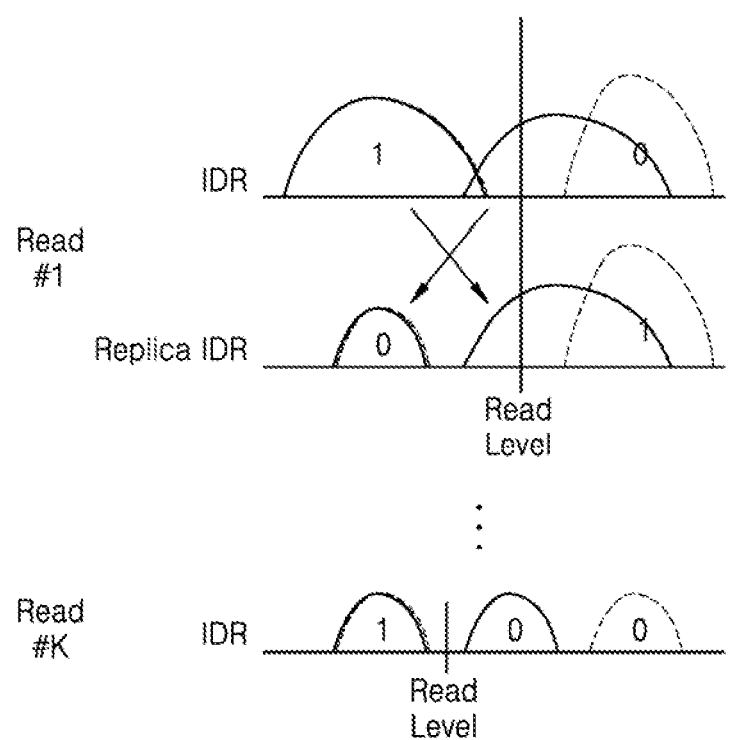
FIGS. 11 and 12 are diagrams illustrating examples of performing a majority rule while changing a read level according to example embodiments.
Figure 12:
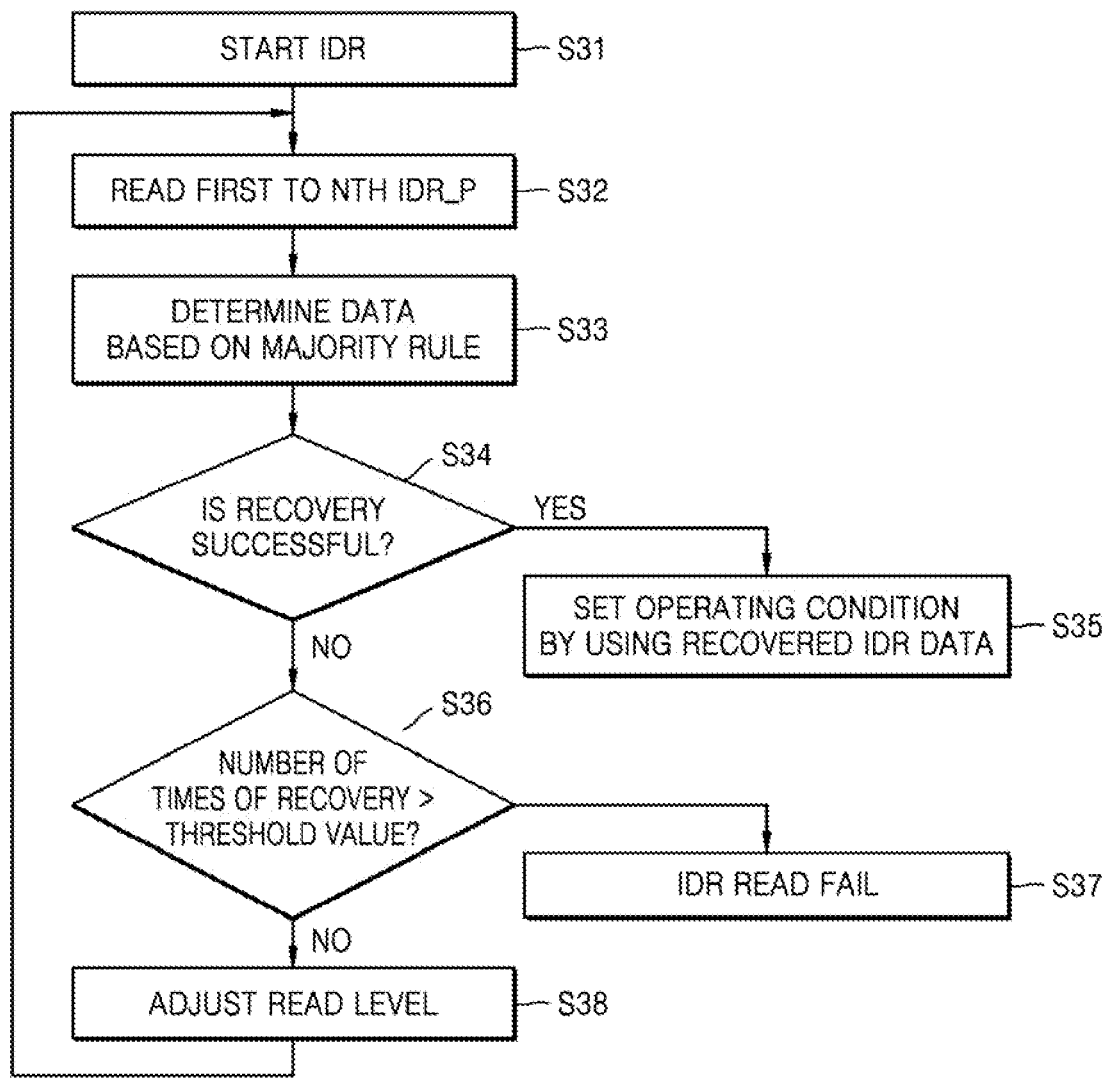

FIGS. 11 and 12 are diagrams illustrating examples of performing a majority rule while changing a read level according to example embodiments.

Referring to FIG. 11, according to example embodiments, a read operation for IDR data and replica IDR data corresponding thereto may be performed, and as shown in FIG. 11, as retention deterioration occurs in some memory cells, bit values of some memory cells may not be determined. Accordingly, a read operation for a plurality of IDR data pairs may be performed, and a bit value determination operation based on a majority rule may be performed based on bit values of the plurality of read IDR data pairs.

If a recovery fail occurs because determination of at least one bit value is impossible even in the recovery operation, a recovery operation may be repeatedly performed by lowering a read level by a certain level. If bit values of all data are determined through the recovery operation using a read level lowered by a certain level, the recovery operation may be completed, and even in a case where the recovery operation is performed by adjusting the read level, when a recovery fail occurs, the read level may be gradually lowered and the recovery operation may be repeatedly performed.

As shown in FIG. 11, when a read level is lowered, a case where memory cells corresponding to off cells are erroneously determined as on cells as a threshold voltage thereof decreases is prevented or reduced, and all bits of IDR data are normally determined in an operation of reading Kth IDR data. That is, while a read level is gradually lowered, an operation of reading IDR data and replica IDR data according to example embodiments and a bit value determination operation based on a majority rule may be repeated, and a case where memory cells corresponding to off cells among memory cells storing IDR data are erroneously determined as on cells may be prevented or reduced.

FIG. 12 is a flowchart illustrating an operating method of a memory system, according to an example embodiment.

In describing an embodiment shown in FIG. 12, detailed descriptions related to a reading operation for inverted replica IDR data and an IDR data pair are omitted.

Referring to FIG. 12, an operation of reading IDR data may be started in a process of initializing the memory system (operation S31).

First to Nth IDR data pairs IDR_P may be read according to example embodiments (operation S32).

Bit values of the IDR data may be determined through a recovery operation according to a majority rule based on at least some of the read first to Nth IDR data pairs IDR_P (operation S33).

Whether recovery is successful may be determined according to whether all of the bit values of the IDR data are normally determined (operation S34). As a result of the determining, when it is determined that the recovery is successful, a setting operation for the memory system by using recovered IDR data may be performed (operation S35). In contrast, when it is determined that the recovery fails, it may be determined that whether the number of times of performing the recovery operation using the first to Nth IDR data pairs IDR_P is greater than a threshold value (operation S36).

If the number of times of performing the recovery operation using the first to Nth IDR data pairs IDR_P is greater than the threshold value, it may be finally determined that reading of the IR data in the process of the initializing has failed (operation S37). In contrast, when the number of times of performing the recovery operation using the first to Nth IDR data pairs IDR_P is not greater than the threshold value, a read level for reading data of the first to Nth IDR data pairs IDR_P may be adjusted (operation S38), and for example, the read level may be reduced according to the embodiments described above. Also, a read operation for the first to Nth IDR data pairs IDR_P and a bit value determination operation based on a majority rule may be performed again using the reduced read level.

Figure 13:
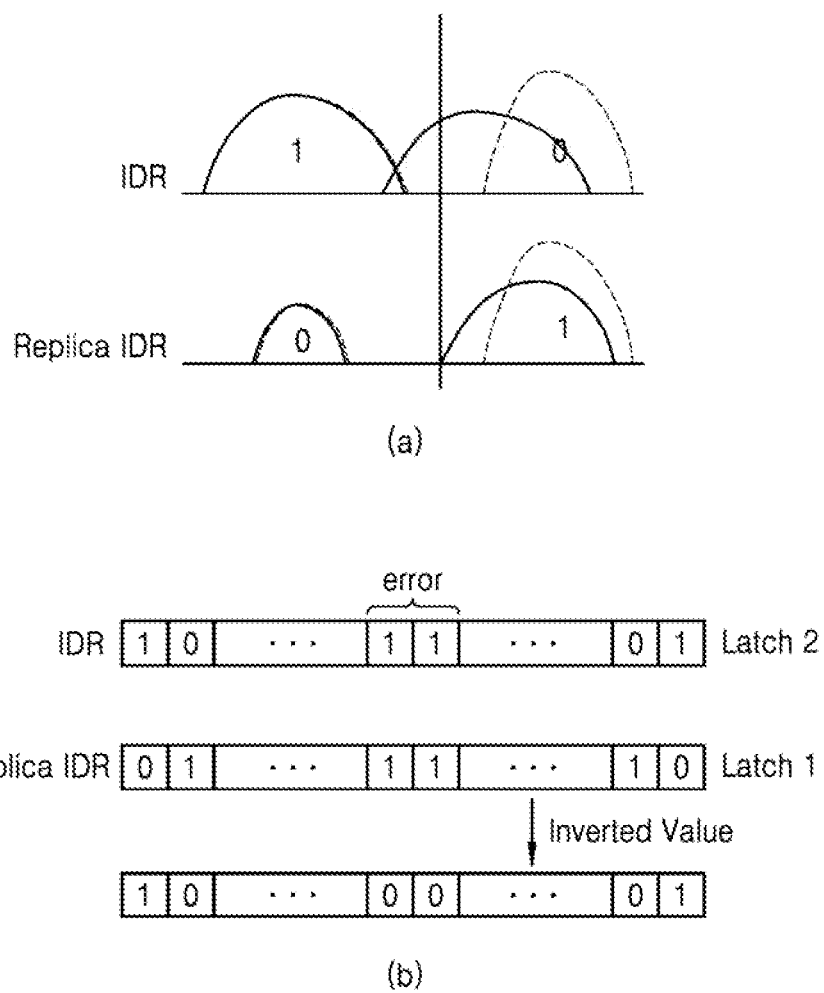
FIG. 13 is a diagram illustrating an example of determining bit values of IDR data, according to example embodiments.

FIG. 13 is a diagram illustrating an example of determining bit values of IDR data, according to example embodiments.

In FIG. 13, errors in IDR data are repaired using replica IDR data without application of a majority rule. Also, in FIG. 13, bit values of data read from a memory cell are stored in a latch without being inverted.

Referring to (a) of FIG. 13, deterioration may occur in off cells among memory cells storing IDR data, and thus, bit values of "0" may be erroneously determined as "1" in some memory cells. Also, whether a read fail of the read IDR data occurs may be determined based on various methods (for example, on cell or off cell counting), and as the read fail is determined, the read IDR data may be copied from a first latch to a second latch as shown in (b) of FIG. 13.

Meanwhile, a read operation for memory cells storing replica IDR data may be performed, and because deterioration of the memory cells storing the replica IDR data is relatively small, it may be determined that a read fail of the read replica IDR data has not occurred. In this case, data having inverted bit values of the IDR data may be stored in the first latch, and when a memory device provides the IDR data to a controller, values obtained by inverting bit values of the replica IDR data stored in the first latch may be provided as IDR to the controller.

Figure 14:
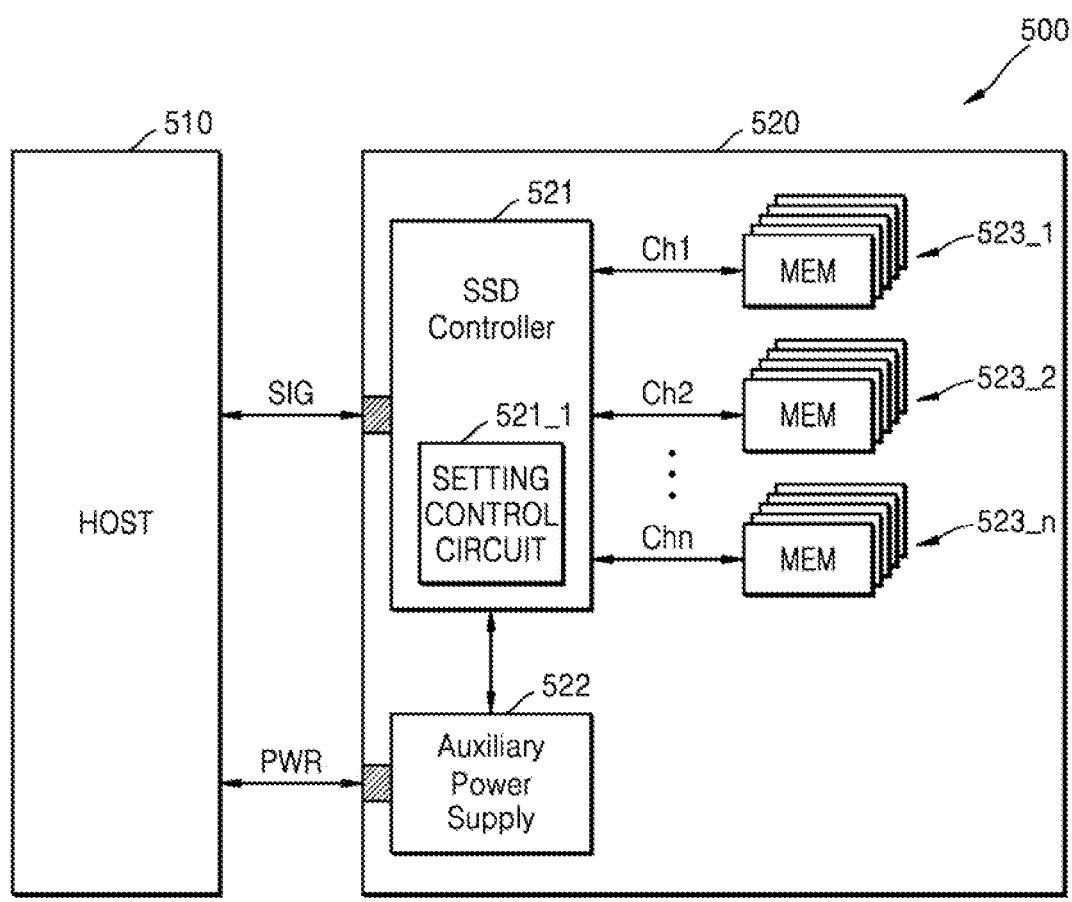
FIG. 14 is a block diagram illustrating an example in which a memory device is applied to a solid-state drive (SSD) system, according to example embodiments.

FIG. 14 is a block diagram illustrating an example in which a memory device is applied to a solid-state drive (SSD) system, according to example embodiments.

Referring to FIG. 14, an SSD system 500 may include a host 510 and an SSD 520. The SSD 520 transmits and receives a signal to and from the host 510 through a signal connector, and receives a power source through a power supply connector. The SSD 520 may include an SSD controller 521, an auxiliary power supply device 522, and memory devices 523_1 to 523_n. The memory devices 523_1 to 523_n may be vertically stacked NAND flash memory devices. In this case, the SSD 520 may be implemented according to example embodiments described above with reference to FIGS. 1 to 13. That is, each of the memory devices 523_1 to 523_n provided in the SSD 520 may store an IDR data pair in relation to an operating environment setting, and each of IDR data pairs may include IDR data and replica IDR data including inverted bit values. Also, the SSD controller 521 may include a setting control circuit 521_1 that sets an operating environment of the SSD system 500 based on IDR data received from the memory devices 523_1 to 523_n.

As described above, embodiments may provide a memory device capable of stably repairing errors in setting data read from the memory device, and an operating method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device comprising:
a cell array including a plurality of cell blocks, each cell block including a plurality of pages; and
a control logic configured to control a program and read operation on the cell array, wherein:
at least one page of the cell array stores information data read (IDR) data that includes information related to a setting operation of the memory device, and at least one other page of the cell array stores replica IDR data including inverted bit values of the IDR data;
the IDR data and the replica IDR data constitute one IDR data pair;
a plurality of IDR data pairs is stored in the cell array;
the control logic is configured to, when a read fail of the IDR data occurs:
control a recovery operation for repairing errors in the IDR data by reading the replica IDR data,
control the read operation so that the plurality of IDR data pairs is read, and
based on the plurality of read IDR data pairs, perform the recovery operation for repairing the errors that have occurred in the IDR data; and
wherein the control logic is further configured to determine a bit value of each bit of the IDR data based on a majority rule with respect to bit values determined from each of the plurality of read IDR data pairs.

2. The memory device as claimed in claim 1, wherein the replica IDR data and the IDR data are stored in different pages of an identical cell block.

3. The memory device as claimed in claim 1, wherein the replica IDR data and the IDR data are stored in different cell blocks.

4. The memory device as claimed in claim 1, wherein the control logic is configured to, when the errors are not repaired by the majority rule, perform a control operation so that a bit value determination operation based on the read operation for the plurality of IDR data pairs and the majority rule is repeatedly performed while adjusting a read level used for the read operation.

5. The memory device as claimed in claim 1, further comprising, for each of the plurality of IDR data pairs, a first latch storing the read IDR data and a second latch storing the inverted bit values of the read replica IDR data,
wherein the control logic is configured to determine bit values of the IDR data based on bit values stored in the first latch and the second latch.

6. The memory device as claimed in claim 1, wherein the control logic is configured to, when a read fail occurs in the read IDR data and a read fail does not occur in the read replica IDR data, repair the errors by using bit values of the replica IDR data.

7. The memory device as claimed in claim 6, wherein the control logic is configured to, according to whether the read fail of the IDR data and the replica IDR data occurs, output the IDR data to the outside or output the inverted bit values of the replica IDR data to the outside.

8. An operating method of a memory device, the operating method comprising:
reading, from a cell array of the memory device, information data read (IDR) data that includes information related to a setting operation of the memory device;

determining whether a read fail of the read IDR data occurs;

when the read fail occurs in the read IDR data, reading, from the cell array, replica IDR data including inverted bit values with respect to the IDR data; and performing a recovery operation for repairing errors in the IDR data by using the read replica IDR data;

wherein error-repaired IDR data is generated based on the read replica IDR data when there is no memory cell that is determined as an on-cell in both the IDR data and the replica IDR data.

9. The operating method as claimed in claim 8, further comprising, when a read fail does not occur in the read replica IDR data, outputting, to the outside, the inverted bit values of the read replica IDR data as the information related to the setting operation.

10. The operating method as claimed in claim 8, further comprising:

when the recovery operation based on the plurality of IDR data pairs fails, re-performing a read operation on the plurality of IDR data pairs by adjusting a read level used for the read operation; and re-performing the recovery operation by using the plurality of IDR data pairs that are read according to the re-performing of the read operation.

11. The operating method as claimed in claim 8, wherein, after a precharge operation is selectively performed on bit lines connected to memory cells determined as on cells in a process of reading the IDR data, reading of the replica IDR data is performed.

12. A memory device, comprising:

a cell array including a plurality of cell blocks, each including a plurality of pages; and a control logic configured to control a program and read operation on the cell array, wherein:

first to Nth IDR data pairs (N is an integer of 2 or more) are stored in the cell array, each of the first to Nth IDR data pairs includes information data read (IDR) data, including information related to a setting operation of the memory device, and replica IDR data, including inverted bit values of the IDR data, and the control logic is configured to:

perform a recovery operation for repairing errors in the IDR data based on at least one IDR data pair among the first to Nth IDR data pairs;

read the replica IDR data of the first IDR data pair when a read fail occurs in the IDR data of the first IDR data pair, and repair the errors in the IDR data by using the replica IDR data of the first IDR data pair when a read fail does not occur in the replica IDR data of the first IDR data pair;

when the read fail occurs in the replica IDR data of the first IDR data pair, repair the errors in the IDR data by reading the first to Nth IDR data pairs;

determine bit values of bits included in the IDR data from each of the first to Nth IDR data pairs, and based on a majority rule with respect to the bit values determined from the first to Nth IDR data pairs, repair the errors in the IDR data.

* * * * *